(12) United States Patent
Law et al.

(10) Patent No.: US 10,468,171 B1
(45) Date of Patent: Nov. 5, 2019

(54) INTEGRATED CIRCUITS WITH MAGNETIC TUNNEL JUNCTIONS AND METHODS OF PRODUCING THE SAME

(71) Applicant: Globalfoundries Singapore Pte. Ltd., Singapore (SG)

(72) Inventors: Wai Cheung Law, Singapore (SG); Taiebeh Tahmasebi, Singapore (SG); Dimitri Houssameddine, Singapore (SG); Michael Nicolas Albert Tran, Singapore (SG); Chim Seng Seet, Singapore (SG); Kai Hung Alex See, Singapore (SG); Wen Siang Lew, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 8 days.

(21) Appl. No.: 16/019,751

(22) Filed: Jun. 27, 2018

(51) Int. Cl.
| | |
|---|---|
| *H01F 10/32* | (2006.01) |
| *H01L 27/22* | (2006.01) |
| *G11C 11/16* | (2006.01) |
| *H01L 43/10* | (2006.01) |
| *H01F 41/32* | (2006.01) |
| *H01L 43/02* | (2006.01) |
| *H01L 43/12* | (2006.01) |

(52) U.S. Cl.
CPC ........ *H01F 10/3259* (2013.01); *G11C 11/161* (2013.01); *H01F 41/32* (2013.01); *H01L 27/222* (2013.01); *H01L 43/02* (2013.01); *H01L 43/10* (2013.01); *H01L 43/12* (2013.01); *H01F 10/329* (2013.01); *H01F 10/3286* (2013.01)

(58) Field of Classification Search
CPC ............ H01F 10/3259; H01F 10/3286; H01F 10/329; H01F 41/32; G11C 11/161; H01L 27/222; H01L 43/02; H01L 43/10; H01L 43/12
See application file for complete search history.

(56) References Cited

U.S. PATENT DOCUMENTS

| | | | |
|---|---|---|---|
| 8,324,697 B2 | 12/2012 | Worledge | |
| 8,541,855 B2 | 9/2013 | Jan et al. | |
| 8,698,261 B2 | 4/2014 | Jan et al. | |
| 9,281,468 B2 | 3/2016 | Min et al. | |
| 9,419,207 B2 | 8/2016 | Huai et al. | |
| 2010/0096716 A1 | 4/2010 | Ranjan et al. | |
| 2014/0284735 A1* | 9/2014 | Nakayama | H01L 43/08 257/421 |
| 2018/0366172 A1* | 12/2018 | Wang | H01L 43/08 |

* cited by examiner

*Primary Examiner* — Yosef Gebreyesus
(74) *Attorney, Agent, or Firm* — Thompson Hine LLP

(57) ABSTRACT

Integrated circuits and methods of producing the same are provided. In an exemplary embodiment, an integrated circuit includes a magnetic tunnel junction stack. The magnetic tunnel junction stack includes a seed layer, first and second pinned layers, and a coupling layer. The seed layer includes holmium. The first pinned layer overlies the seed layer, where the first pinned layer is magnetic, and the non-magnetic coupling layer overlies the first pinned layer. The second pinned layer overlies the coupling layer, where the second pinned layer is also magnetic.

17 Claims, 2 Drawing Sheets

INTEGRATED CIRCUITS WITH MAGNETIC TUNNEL JUNCTIONS AND METHODS OF PRODUCING THE SAME

TECHNICAL FIELD

The technical field generally relates to integrated circuits with magnetic tunnel junctions (MTJs) and methods of producing the same, and more particularly relates to integrated circuits with MTJs having increased thermal stability and methods of producing the same.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction (MTJ) where information may be stored. A MTJ stack has at least two magnetic layers separated by a non-magnetic barrier, where a fixed layer has a set magnetic property and a free layer has a programmable magnetic property for storing information. If the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." The MTJ stack is typically incorporated into a memory cell, and many memory cells with MTJ stacks are incorporated into a memory bank.

The magnetic properties of the free layer may be changed when the memory cell is programmed, where the alignment of the free layer magnetic properties is changed relative to the fixed layer magnetic properties in the programming process. Programming changes the magnetic properties of the free layer and the fixed layer from anti-parallel to parallel, or from parallel to anti-parallel. The strength of the magnetic properties of the pinned layer impacts the MTJ stack, where stronger magnetic properties produce more reliable information storage. The fixed layer may include a first and second pinned layer, where the first and second pinned layers are magnetically coupled to produce a more robust overall fixed layer. The first and second pinned layers should be crystalline, with the proper type of crystal to support the desired magnetic properties. A seed layer is typically produced underlying the first pinned layer to induce the desired crystallinity. However, the seed layer often requires excessive thicknesses to support the desired crystallinity, where the excessive thicknesses increase the aspect ratio of the MTJ stack and thereby reduce the structural stability of the stack. Furthermore, the seed layer should be thermally robust such that it can withstand annealing, solder reflow processes, or other manufacturing processes.

Accordingly, it is desirable to provide integrated circuits with magnetic tunnel junction stacks having higher thermal robustness and stability, as compared to traditional magnetic tunnel junctions, and methods for producing the same. In addition, it is desirable to provide integrated circuits with improved crystalline structure in the fixed layer, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a magnetic tunnel junction stack. The magnetic tunnel junction stack includes a seed layer, first and second pinned layers, and a coupling layer. The seed layer includes holmium. The first pinned layer overlies the seed layer, where the first pinned layer is magnetic, and the non-magnetic coupling layer overlies the first pinned layer. The second pinned layer overlies the coupling layer, where the second pinned layer is also magnetic.

A method of producing an integrated circuit is provided in another embodiment. The method includes forming a seed layer overlying a bottom electrode, where the seed layer is amorphous. A magnetic first pinned layer is formed overlying the seed layer, and a non-magnetic coupling layer is formed overlying the first pinned layer. A second pinned layer is formed overlying the coupling layer, where the second pinned layer is magnetic. The seed layer is annealed to produce face centered cubic crystals within the seed layer.

A method of producing an integrated circuit is provided in yet another embodiment. The method includes forming a seed layer overlying a bottom electrode, where the seed layer includes holmium at from about 30 to about 100 weight percent, based on a weight of the seed layer. A magnetic first pinned layer is formed overlying the seed layer, and a non-magnetic coupling layer is formed overlying the first pinned layer. A second pinned layer is formed overlying the coupling layer, where the second pinned layer is magnetic.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes a magnetic tunnel junction (MTJ) stack that includes a seed layer with holmium. The seed layer underlies the fixed layer, and increases the crystalline properties of the fixed layer such that the MTJ stack has higher thermal stability and robustness, and enhanced perpendicular magnetic anisotropy. The holmium has a face centered cubic (FCC) crystalline structure that transfers to the fixed layer. The holmium is deposited as an amorphous layer, and the crystalline structure is produced in the seed layer during an anneal.

Figure 1:
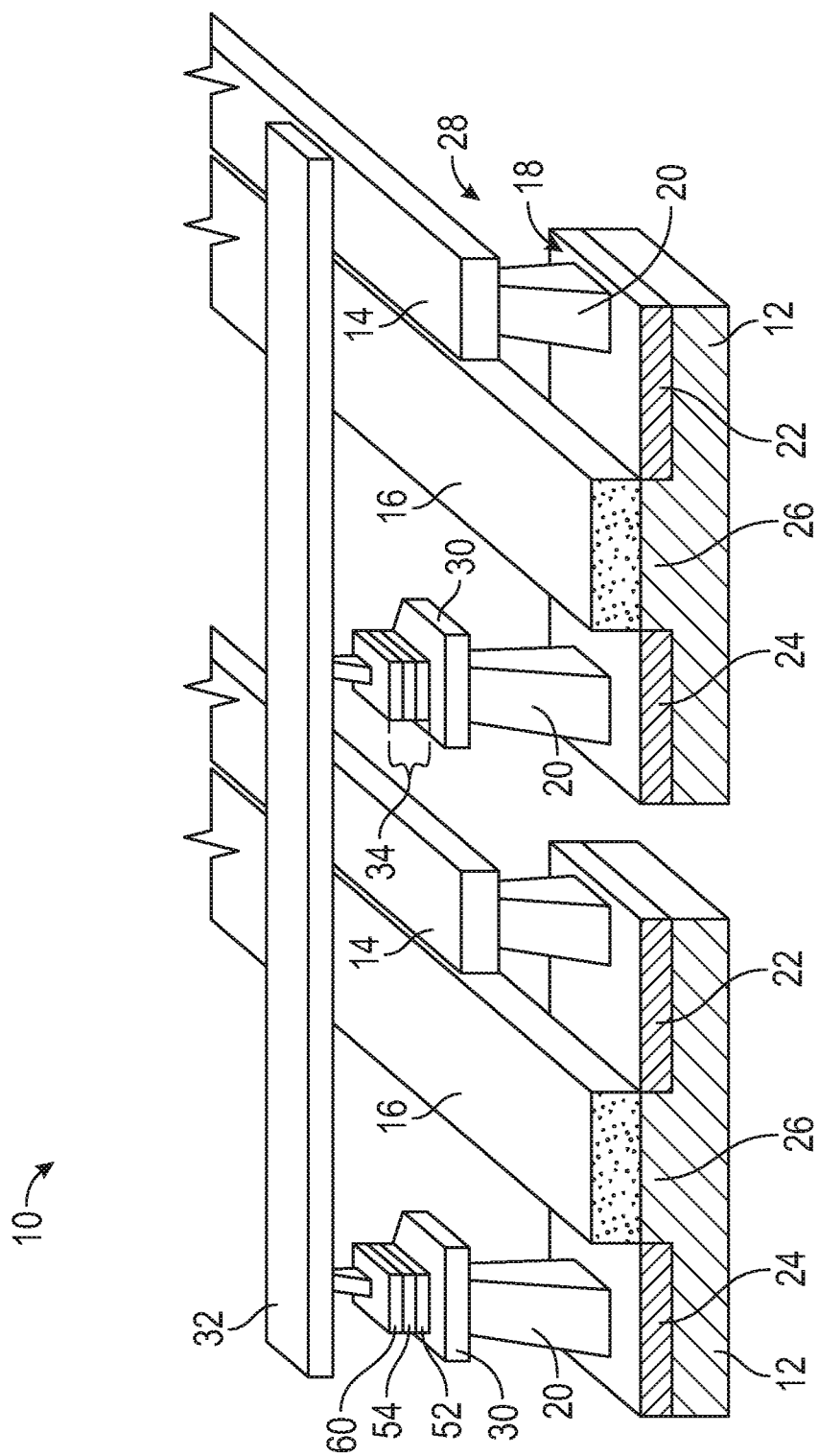
FIG. 1 is a perspective sectional view of selected portions of an embodiment of an integrated circuit and methods of producing the same, where some components are not illustrated to better display the features of interest for this description.

Referring to an exemplary embodiment illustrated in FIG. 1, an integrated circuit 10 includes a substrate 12 formed of a semiconductor material. FIG. 1 omits some components of the integrated circuit 10, such as interlayer dielectrics, to more clearly illustrate the features of current interest. Furthermore, FIG. 1 depicts one embodiment, and other layouts, orientations, or configurations are also possible. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. A material that "primarily" includes a recited element/compound includes that element/compound in an amount of at least about 50 weight percent, based on the total weight of the referenced component or material. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

Figure 2:
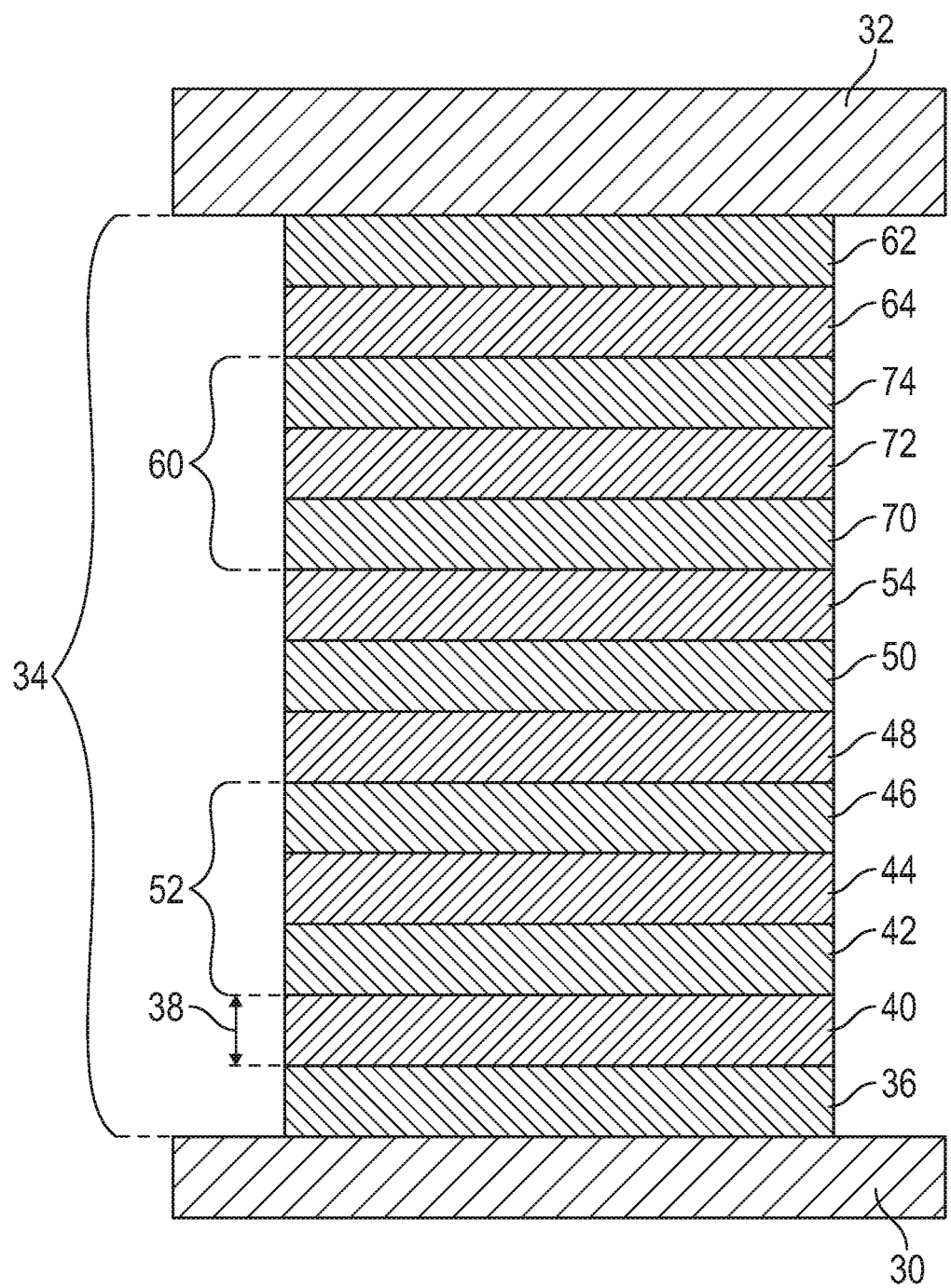
FIG. 2 illustrates, in a cross sectional view, an integrated circuit and methods of producing the same in accordance with exemplary embodiments.

In an exemplary embodiment, a gate 16 overlies the substrate 12, where a gate insulator (not illustrated) may be positioned between the gate 16 and the substrate 12. As used herein, the term "overlying" means "over" such that an intervening layer may lie between the overlying component (the gate 16 in this example) and the underlying component (the substrate 12 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the FIGS, especially FIG. 2. It is to be understood that spatially relative terms refer to the orientation in the figures, so if the integrated circuit 10 were to be oriented in another manner the spatially relative terms would still refer to the orientation depicted in the figures. Thus, the exemplary terms "over" and "under" remain the same even if the device is twisted, flipped, or otherwise oriented other than as depicted in the figures. The substrate 12 has a substrate surface 18 that is depicted horizontally in FIG. 1, and the substrate surface 18 may be used as a spatial reference herein.

In an exemplary embodiment, the gate 16 includes an electrically conductive material. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from more than about $1 \times 10^{-4}$ ohm meters to less than about $1 \times 10^4$ ohm meters. In one exemplary embodiment, the gate 16 includes polysilicon doped with conductivity determining impurities, but other materials may be used in alternate embodiments.

A source 22 may be formed within the substrate 12 on one side of the gate 16, and a drain 24 may be formed within the substrate 12 on the opposite side of the gate 16. In the illustrated embodiment, the substrate surface 18 is the upper surface of the source 22 and drain 24, but other embodiments are also possible. The source 22 and drain 24 include conductivity determining impurities (sometimes referred to as "dopants") at a higher concentration than in other areas within the substrate 12. A channel 26 is disposed within the substrate 12 between the source 22 and drain 24 and underlying the gate 16. FIG. 1 illustrates a planar transistor 28, where the transistor 28 includes the gate 16, the source 22, the drain 24, and the channel 26. However, finned field effect transistors (not illustrated), transistors with the source and drain formed overlying the substrate (not illustrated), or other types of transistors 28 may be utilized in alternate embodiments.

A memory structure is associated with the transistor 28. In the illustrated embodiment, a bottom electrode 30 is in electrical communication with the drain 24, and a top electrode 32 overlies the bottom electrode 30. The top electrode 32 may function as a "bit line" in some embodiments, but other embodiments are also possible. A contact 20 may be used to electrically connect the drain 24 with the bottom electrodes 30, and another contact (not illustrated) and/or other components may be utilized to form other electrical connections for electrical communication. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. A source line 14 may be in electrical communication with the source 22.

A magnetic tunnel junction stack 34 (MTJ stack) is positioned between the bottom and top electrodes 30, 32, where the MTJ stack 34 is in electrical communication with the bottom and top electrodes 30, 32. The bottom and top electrodes 30, 32 may include several layers (not illustrated,) such as a seed layer, a core, and a cover, and may include tantalum, tantalum nitride, nickel, copper, aluminum, or other electrically conductive materials. The MTJ stack 34 and the bottom and top electrodes 30, 32 may also be connected to other electronic components instead of the transistor 28, or in addition to the transistor 28 in various embodiments. The MTJ stack 34 may be formed by depositing the various layers therewithin (described more fully below), where the various layers within the MTJ stack 34 may be formed by sputtering, ion beam deposition, or other techniques using the appropriate materials. The area where the MTJ stack 34 is to be formed may then be lithographically protected, and the exposed portions removed with appropriate etchants.

The MTJ stack 34 includes several layers, where three general layers are depicted in FIG. 1. The three general layers illustrated are a fixed layer 52, a tunnel barrier layer 54 overlying the fixed layer 52, and a total free layer 60 overlying the tunnel barrier layer 54. The illustrated layers of the MTJ stack 34 and the exemplary sub-layers are described more fully below. An exemplary embodiment of the MTJ stack 34 is illustrated in greater detail in FIG. 2. The MTJ stack 34 includes several layers overlying each other, where the illustrated layers may include sub-layers in some embodiments and where additional layers may also be present. In an exemplary embodiment, a wet layer 36 overlies the bottom electrode 30, a seed layer 40 overlies the wet layer 36 and the bottom electrode 30, a first pinned layer 42 overlies the seed layer 40, a coupling layer 44 overlies the first pinned layer 38, a second pinned layer 46 overlies the coupling layer 44. The first and second pinned layers 42, 46 and the coupling layer 44 form a fixed layer 52. The first and second pinned layers 42, 46 are magnetic, and the coupling layer 44 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field.

The wet layer 36 aids in adhesion of overlying layers, and may include tantalum in some embodiments, but the wet layer 36 may also include tantalum nitride, ruthenium, platinum, tungsten, and hafnium. In some embodiments, the wet layer 36 may not be present, so the seed layer 40 may directly overlie and contact the bottom electrode 30. In an exemplary embodiment, the seed layer 40 includes holmium at about 30 to about 100 weight percent, or about 60 to about 100 weight percent, or about 80 to about 100 weight percent in various embodiments, all based on a total weight of the seed layer 40. The seed layer 40 may also include nickel (Ni), chromium (Cr), platinum (Pt), ruthenium (Ru), tungsten (W), magnesium (Mg) and/or terbium (Tb) in various embodiments, where the elements other than holmium make up the remainder of the seed layer 40. In an exemplary embodiment, the seed layer 40 has a seed layer thickness 38 of about 10 nanometers or less. If the seed layer thickness 38 is too large, the MTJ stack 34 may become unstable and structurally unsound during subsequent processing steps, as can be imagined as a very tall and thin tower. As such, controlling the seed layer thickness 38 to within a specified amount may reduce quality control failures.

The seed layer 40 may be deposited as an amorphous layer, and then annealed to produce a crystalline structure. After an anneal, the seed layer 40 has a seed layer crystallinity with a face centered cubic (FCC) crystalline structure in some embodiments, and the size of the crystals may aid in reducing crystalline strain in overlying layers. As such, the inter-atomic distance between the elements in the seed layer 40 and the overlying layers may be matched or compatible such that the seed layer 40 and the first and second pinned layers 42, 46 include crystals that have low or no crystalline strain. Interatomic distances for the coupling layer 44 may also optionally be matched to that of the seed layer 40 in some embodiments, to minimize crystal strain.

The seed layer 40 may be annealed before other overlying layers are deposited, or the seed layer 40 may be annealed after the overlying layers are deposited. Testing indicates annealing after overlying layers are deposited does produce the desired crystal structure in the seed layer 40 and the overlying first and second pinned layers 42, 46. The anneal may be at about 400 degrees Celsius (° C.) or higher for a time period of about 1 hour or more in an exemplary embodiment, but other annealing conditions are also possible. For example, the seed layer 40 (and other layers that are present during the anneal) may be annealed for time periods of about 15 minutes or more, about 30 minutes or more, about 45 minutes or more, or one hour or more in various embodiments. Testing indicates the desired crystal structure is formed during about 30 minute anneals at about 400° C., and also at longer anneals at about 400° C. Testing has shown that extended anneals at 400° C. do not result in damage to the fixed layer 52 when holmium is used in the seed layer 40, so the use of holmium in the seed layer 40 improves the thermal stability and robustness of the PMJ stack 34.

In an exemplary embodiment, the seed layer 40 is formed by sputtering holmium (and other elements as desired) in an argon environment with a gas flow rate of about 2 standard cubic centimeters per minute (SCCM) at a sputter power of about 50 watts and a chamber pressure of about $(1*e)^{-8}$, however other deposition techniques or parameters may also be utilized in various embodiments.

The first and/or second pinned layers 42, 46 include cobalt platinum compounds in an exemplary embodiment, but the first and/or second pinned layers 42, 46 may include various combinations of cobalt (Co), platinum (Pt), nickel (Ni), terbium (Tb), palladium (Pd), iron (Fe), boron (B), or other materials in alternate embodiments. In an exemplary embodiment, each of the first pinned layer 42 and the second pinned layer 46 include cobalt and platinum at about 90 to about 100 weight percent, based on a total weight of the first or second pinned layer 42, 46, respectively. The different elements in the first and second pinned layer 42, 46 may be alloyed or formed of successive layers, so the first and second pinned layers 42, 46 may independently include a plurality of sub-layers in some embodiments. The first and second pinned layers 42, 46 are magnetic, where the magnetic property of the combined first and second pinned layers 42, 46 is the magnetic property for the fixed layer 52 in embodiments with only 2 pinned layers. The magnetic properties of the fixed layer 52 are utilized for memory purposes in the MTJ stack 34. It has been found that the crystallinity of the first and second pinned layers 42, 46 when formed overlying a holmium seed layer 40 results in a stronger paramagnetic anisotropy than when using seed layers of various combinations of hafnium (Hf), nickel (Ni), chromium (Cr), iron (Fe), tantalum (Ta), ruthenium (Ru), or copper (Cu), where the stronger perpendicular magentic anisotropy improves the overall operation of a memory cell that includes the MTJ stack 34.

The coupling layer 44 includes ruthenium (Ru), rhodium (Rh), iridium (Ir) or other materials in exemplary embodiments. The coupling layer 44 provides an anti-ferromagnetic exchange between the first and second pinned layers 42, 46 that may help reduce or compensate for stray magnetic field effects from the first and/or second pinned layers 42, 46. Testing has shown that the use of ruthenium in the coupling layer 44 can produce strong paramagnetic anisotropy in the fixed layer 52. In exemplary embodiments, the coupling layer 44 includes ruthenium at from about 50 to about 100 weight percent, or from about 80 to 100 weight percent, based on a total weight of the coupling layer 44.

A transition layer 48 overlies the second pinned layer 46 and the fixed layer 52, and a polarizer layer 50 overlies the transition layer 48. The transition layer 48 is nonmagnetic and the polarizer layer 50 is magnetic in an exemplary embodiment. The transition layer 48 includes tantalum, iron, tungsten, molybdenum, terbium, iron, cobalt, or other elements, either as alloys or as one or more sub-layers, in some embodiments. The transition layer 48 serves to break the crystalline structure from the underlying second pinned layer 46 (or other pinned layer, where more than 2 pinned layers are utilized), so the transition layer 48 is amorphous in some embodiments. The transition layer 48 may be thin enough such that a crystalline structure is not formed. The transition layer 48 is non-magnetic, and the amorphous nature of the transition layer 48 allows for the non-magnetic characteristic even in embodiments that include iron, cobalt, or other materials that typically are magnetic.

The polarizer layer 50 includes cobalt, iron, boron, or other elements, which may be present as alloys or as individual components, and which may be present as a single layer or as multiple layers, in various embodiments. The polarizer layer 50 may have a crystalline structure that is imparted to overlying layers in some embodiments, and may improve spin polarization efficiency in the MTJ stack 34. The polarizer layer 50 may have a face centered cubic crystalline structure, but other types of crystalline structures are also possible.

A tunnel barrier layer 54 overlies the polarizer layer 50, so the tunnel barrier layer 54 also overlies the transition layer 48, the fixed layer 52, and the seed layer 40. The tunnel barrier layer 54 is non-magnetic, and magnetically decouples the free layer(s) (described more fully below) from the fixed layer 52. The tunnel barrier layer 54 includes magnesium oxide in an exemplary embodiment, but the tunnel barrier layer 54 may be aluminum oxide or other materials suitable for magnetically decoupling overlying layers from underlying layers in alternate embodiments.

A total free layer 60 overlies the tunnel barrier layer 54, and a capping layer 62 overlies the total free layer 60. An optional top barrier layer 64 overlies total free layer 60 in some embodiments, where the capping layer 62 overlies the optional top barrier layer 64 when present. As such, the total free layer 60 is sandwiched between the tunnel barrier layer 54 and the top barrier layer 64 in embodiments where the top barrier layer 64 is present. The Top electrode 32 overlies the capping layer 62, so the top electrode 32 also overlies the optional top barrier layer 64, the total free layer 60, and the tunnel barrier layer 54.

The total free layer 60 includes a first free layer 70, an insertion layer 72 overlying the first free layer, and a second free layer 74 overlying the insertion layer 72. The first and second free layers 70, 74 are magnetic, and may include sub-layers. For example, the first free layer 70 may include 1, 2, or more sub-layers, and the second free layer 74 may include 1, 2, or more sub-layers. The first and second free layers 70, 74 may have the same composition, or they may have different compositions, and there may be more, less, or the same number of sub-layers in the first and second free layers 70, 74. The elements in the first and second free layers 70, 74 may be present as alloys or as layers of pure material or layers of alloys. In an exemplary embodiment, the first and/or second free layers 70, 74 include cobalt, iron, boron, or other elements. The first and second free layers 70, 74 are magnetically "soft" such that the spin transfer torque and the direction of magnetism can be changed. The first and second free layers 70, 74 are magnetically anisotropic, and should have sufficient thermal stability to withstand processing temperatures without a loss of magnetism. The first and second free layers 70, 74 may have a thickness of from about 0.1 to about 1 nanometer in some embodiments, but other thicknesses are also possible.

The insertion layer 72 is positioned between the first and second free layers 70, 74, and the insertion layer 72 is non-magnetic. The insertion layer 72 may provide ferromagnetic coupling between the first and second free layers 70, 74, and may be thin enough to be amorphous. However, in some embodiments the insertion layer 72 may be crystalline. In some embodiments, the insertion layer 72 includes tantalum, molybdenum, tungsten, iron, or other components, as alloys or as individual elements.

The capping layer 62 overlies the total free layer 60, and the top barrier layer 64 in embodiments where the top barrier layer 64 is present. The capping layer 62 may further promote the magnetic anisotropic effect of the MTJ stack 34. The capping layer 62 may include one or more of magnesium oxide, tungsten, ruthenium, platinum, hafnium, nickel chromium, or other materials, either as alloys or as elements. The capping layer 62 is non-magnetic, and the composition of the capping layer 62 is typically dependent on the material of the first and/or second free layers 70, 74. The optional top barrier layer 64 may include magnesium oxide in some embodiments, and the top barrier layer 64 is non-magnetic.

The use of holmium in the seed layer 40 produces a fixed layer 52 capable of withstanding extended exposure to temperatures as high as 400° C. Solder reflow temperatures are typically about 260° C., so the inclusion of the holmium in the seed layer 40 increases the thermal robustness well above the solder reflow temperature. The MTJ stack 34 is typically exposed to solder reflow temperatures, so thermal stability above this temperature can improve the reliability of devices. The increased thermal robustness resulting from the use of holmium in the seed layer 40 of the MTJ stack 34 may allow for anneals or other process steps after formation of the MTJ stack 34 that would damage an MTJ stack 34 without holmium in the seed layer 40, which increases manufacturing options.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising a magnetic tunnel junction stack, wherein the magnetic tunnel junction stack comprises:
   a seed layer, wherein the seed layer comprises holmium;
   a first pinned layer overlying the seed layer, wherein the first pinned layer is magnetic;

a coupling layer overlying the first pinned layer, wherein the coupling layer is non-magnetic; and a second pinned layer overlying the coupling layer, wherein the second pinned layer is magnetic.

2. The integrated circuit of claim 1 wherein the seed layer comprises holmium from about 30 to about 100 weight percent, based on a weight of the seed layer.

3. The integrated circuit of claim 1 wherein the seed layer comprises holmium from about 60 to about 100 weight percent, based on a weight of the seed layer.

4. The integrated circuit of claim 1 wherein the seed layer comprises holmium from about 80 to about 100 weight percent, based on a weight of the seed layer.

5. The integrated circuit of claim 1 wherein the first pinned layer primarily comprises cobalt and platinum.

6. The integrated circuit of claim 1 wherein the first pinned layer comprises cobalt and platinum from about 90 to about 100 weight percent, based on a weight of the first pinned layer.

7. The integrated circuit of claim 1 wherein the coupling layer comprises ruthenium.

8. The integrated circuit of claim 1 wherein the coupling layer comprises ruthenium from about 50 to about 100 weight percent, based on a weight of the coupling layer.

9. The integrated circuit of claim 1 wherein the second pinned layer comprises cobalt and platinum from about 90 to about 100 weight percent, based on a weight of the second pinned layer.

10. The integrated circuit of claim 1 further comprising:
a tunnel barrier layer overlying the second pinned layer, wherein the tunnel barrier layer is non-magnetic;
a first free layer overlying the tunnel barrier layer, wherein the first free layer is magnetic;
an insertion layer overlying the first free layer, wherein the insertion layer is non-magnetic; and
a second free layer overlying the insertion layer, wherein the second free layer is magnetic.

11. The integrated circuit of claim 10 wherein the tunnel barrier layer comprises magnesium oxide.

12. The integrated circuit of claim 1 wherein:
the seed layer comprises said holmium from about 30 to about 100 weight percent, based on a weight of the seed layer;
the first pinned layer comprises cobalt and platinum from about 90 to about 100 weight percent, based on a weight of the first pinned layer;
the coupling layer comprises ruthenium from about 50 to 100 weight percent, based on a weight of the coupling layer; and
the second pinned layer comprises cobalt and platinum from about 90 to about 100 weight percent, based on a weight of the second pinned layer.

13. The integrated circuit of claim 1 wherein the seed layer has a seed layer thickness of about 10 nanometers or less.

14. The integrated circuit of claim 1 further comprising:
a bottom electrode underlying the seed layer, wherein the bottom electrode is an electrical conductor;
a wet layer underlying the seed layer and overlying the bottom electrode.

15. The integrated circuit of claim 14 wherein the wet layer comprises tantalum.

16. The integrated circuit of claim 1 wherein the seed layer comprises face centered cubic crystals.

17. A method of producing an integrated circuit comprising:
forming a seed layer overlying a bottom electrode, wherein the seed layer comprises holmium from about 30 to about 100 weight percent, based on a weight of the seed layer;
forming a first pinned layer overlying the seed layer, wherein the first pinned layer is magnetic;
forming a coupling layer overlying the first pinned layer, wherein the coupling layer is non-magnetic; and
forming a second pinned layer overlying the coupling layer, wherein the second pinned layer is magnetic.

\* \* \* \* \*